US007525240B2

(12) United States Patent
Sasaki (10) Patent No.: US 7,525,240 B2
(45) Date of Patent: Apr. 28, 2009

(54) ELECTRONIC COMPONENT (75) Inventor: Satoshi Sasaki, Yuri-gun (JP)

(73) Assignee: TDK Corporation, Tokyo (JP)

( * ) Notice: Subject to any disclaimer, the term of this patent is extended or adjusted under 35 U.S.C. 154(b) by 525 days.

(21) Appl. No.: 11/109,619

(22) Filed: Apr. 20, 2005

(65) Prior Publication Data
US 2005/0253270 A1    Nov. 17, 2005

(30) Foreign Application Priority Data

| Apr. 26, 2004 | (JP) | ............................. 2004-130144 |
| Mar. 3, 2005 | (JP) | ............................. 2005-058814 |
| Mar. 23, 2005 | (JP) | ............................. 2005-084306 |

(51) Int. Cl.
H01L 41/08 (2006.01)

(52) U.S. Cl. ..................................... 310/364

(58) Field of Classification Search ......... 310/363–366, 310/311; 174/261–262; 29/827
See application file for complete search history.

(56) References Cited

U.S. PATENT DOCUMENTS 3,934,336 A * 1/1976 Morse .......................... 29/827
5,003,131 A * 3/1991 Morikawa et al. ........... 174/261

FOREIGN PATENT DOCUMENTS

| JP | A 62-35509 | 2/1987 |
| JP | A 63-080585 | 4/1988 |
| JP | A 63-153870 | 6/1988 |
| JP | A 11-111564 | 4/1999 |
| JP | A 2002-036567 | 2/2002 |
| JP | A 2002-254634 | 9/2002 |
| JP | A 2002-254657 | 9/2002 |
| JP | A 2004-200373 | 7/2004 |
| JP | A 2004-241669 | 8/2004 |
| JP | A 2004-304025 | 10/2004 |
| JP | A 2005-041052 | 2/2005 |
| JP | A 2005-205769 | 8/2005 |
| WO | WO 2005/002049 A1 | 1/2005 |

* cited by examiner

Primary Examiner—Thomas M. Dougherty
Assistant Examiner—Karen B Addison
(74) Attorney, Agent, or Firm—Oliff & Berridge, PLC (57) ABSTRACT Provided is an electronic component capable of securely soldering an external terminal such as a lead wire to each terminal electrode, while preventing overflow of solder from the area on the terminal electrode.

In the electronic component as a multilayer piezoelectric device, on the occasion of soldering a lead wire 24 to a terminal electrode 17, the lead wire 24 can be placed on a second region R2 higher in height than a first region R1 from a surface 7a of a piezoelectric layer 7. This makes a molten solder 25 more likely to flow from the second region R2 to the first region R1 during the soldering. For this reason, the solder 25 is prevented from overflowing from the area on the terminal electrode 17 even if the amount of the solder for soldering the lead wire 24 to the terminal electrode 17 is increased in order to improve certainty of connection between terminal electrode 17 and lead wire 24. Therefore, it becomes feasible to securely solder the lead wire 24 to the terminal electrode 17, while preventing the solder 25 from overflowing from the area on the terminal electrode 17.

10 Claims, 11 Drawing Sheets

ELECTRONIC COMPONENT

BACKGROUND OF THE INVENTION

1. Field of the Invention

The present invention relates to an electronic component having a substrate, and terminal electrodes provided on a surface of the substrate.

2. Related Background Art

An example of the conventional electronic components of this type is a multilayer piezoelectric device, for example, as described in Japanese Patent Application Laid-Open No. 2002-254634. This multilayer piezoelectric device consists of an alternate stack of piezoelectric layers in each of which a plurality of individual electrodes are formed in a pattern, and piezoelectric layers in each of which a common electrode is formed in a pattern, and the individual electrodes aligned in the stack direction are connected by electroconductive members via through holes formed in the piezoelectric layers.

In this multilayer piezoelectric device, lead wires for connection to a drive power supply are soldered to respective terminal electrodes formed on the uppermost piezoelectric layer. When a voltage is applied between predetermined individual electrodes and common electrodes through the lead wires, active parts (portions to be distorted by piezoelectric effect) corresponding to the predetermined individual electrodes in the piezoelectric layers are selectively displaced.

SUMMARY OF THE INVENTION

Incidentally, concerning the electronic components such as the multilayer piezoelectric devices as described above, there are demands for further improvement in certainty of connection between the terminal electrodes and external terminals such as the lead wires. Such demands can be met by increasing the amount of solder for soldering an external terminal to each terminal electrode, but the increase in the amount of solder can result in overflow of the solder from the area on the terminal electrode. In the worst case, for example, the overflow solder could establish contact between adjacent terminal electrodes to cause a short circuit.

The present invention has been accomplished in view of such circumstances and an object of the present invention is therefore to provide an electronic component capable of securely soldering an external terminal such as a lead wire to each terminal electrode, while preventing the overflow of the solder from the area on the terminal electrode.

In order to achieve the above object, an electronic component according to the present invention is an electronic component comprising a substrate, and a terminal electrode provided on a surface of the substrate, wherein the terminal electrode has a first region located at a first height from the surface of the substrate, and a second region located at a second height higher than the first height from the surface of the substrate.

In this electronic component, on the occasion of soldering an external terminal such as a lead wire to the terminal electrode, the external terminal is soldered to the second region higher in height than the first region from the surface of the substrate, whereupon the molten solder flows toward the first region. For this reason, the solder is prevented from overflowing from the area on the terminal electrode even if the amount of the solder for soldering the external terminal to the terminal electrode is increased in order to improve the certainty of connection between the terminal electrode and the external terminal. Therefore, it is feasible to securely solder the external terminal such as the lead wire to the terminal electrode, while preventing the solder from overflowing from the area on the terminal electrode.

In the above electronic component, preferably, the terminal electrode has a first electrode layer formed on the surface of the substrate, and a second electrode layer formed on a predetermined portion of a surface of the first electrode layer; an exposed portion of the surface of the first electrode layer is the first region, and a surface of the second electrode layer is the second region. This stack configuration of the first electrode layer and the second electrode layer permits the terminal electrode to be readily constructed of the first region located at the first height from the surface of the substrate, and the second region located at the second height higher than the first height from the surface of the substrate.

In the above electronic component, preferably, the first electrode layer is connected to an electroconductive member in a through hole formed in the substrate, and the second electrode layer is laid on the first electrode layer so as to cover an aperture of the through hole. As the second electrode layer covers the aperture of the through hole in this manner, the electroconductive member in the through hole is prevented from dissolving into the molten solder (so called solder leaching) to break electric connection in the through hole on the occasion of soldering the external terminal to the surface of the second electrode layer being the second region.

In the above electronic component, preferably, the second electrode layer is comprised of an electroconductive material containing glass frit. This improves the stick of the second electrode layer to the first electrode layer. In addition, the electroconductive member in the through hole can be more securely prevented from dissolving into the molten solder on the occasion of soldering the external terminal to the surface of the second electrode layer.

In the above electronic component, preferably, a plurality of terminal electrodes are arrayed along a predetermined direction on the surface of the substrate, and one terminal electrode out of two adjacent terminal electrodes has the second region on one end side in a direction perpendicular to the predetermined direction, and the other terminal electrode has the second region on the other end side in the direction perpendicular to the predetermined direction. This permits the external terminal to be soldered to the one end side in the direction perpendicular to the predetermined direction, for one terminal electrode out of two adjacent terminal electrodes, and permits the external terminal to be soldered to the other end side in the direction perpendicular to the predetermined direction, for the other terminal electrode. This prevents external terminals to be connected to respective terminal electrodes, from adjoining in the predetermined direction. Therefore, this configuration facilitates the connection of the external terminals to respective terminal electrodes and securely prevents a short circuit due to the solder joining two adjacent terminal electrodes.

In the above electronic component, preferably, an external terminal is connected to the terminal electrode by a solder. In this electronic component, the solder is prevented from overflowing from the area on the terminal electrode even if the amount of the solder for soldering the external terminal to the terminal electrode is increased in order to improve the certainty of connection between the terminal electrode and the external terminal, as described above. Therefore, the overflow of the solder from the area on the terminal electrode is securely prevented and the external terminal is surely soldered to the terminal electrode.

Another electronic component according to the present invention is an electronic component comprising a substrate, and a terminal electrode provided on a surface of the substrate, wherein the terminal electrode has a first electrode layer formed on the substrate, and a second electrode layer formed in a convex shape on the first electrode layer so as to cover a part of the first electrode layer, and wherein a surface of the second electrode layer has a curved shape.

In this electronic component, the surface of the second electrode layer of the convex shape laid on the first electrode layer has the curved shape. For this reason, point contact is achieved between the external terminal and the second electrode layer on the occasion of soldering the external terminal to the second electrode layer of the terminal electrode in order to electrically connect the external terminal such as the lead wire to the terminal electrode, whereby the solder becomes easier to melt with respect to the second electrode layer by virtue of concentration of heat on the solder. Therefore, the external terminal can be securely soldered to the terminal electrode. Since the surface of the second electrode layer has the curved shape, the molten residual solder becomes smoothly flowing from the second electrode layer toward the first electrode layer. This can prevent the residual solder from overflowing from the area on the terminal electrode even if the amount of the solder is increased for more securely connecting the external terminal to the terminal electrode. Furthermore, the second electrode layer of the convex shape having the curved shape can be readily formed, for example, by baking, screen printing, or the like.

In the above electronic component, the first electrode layer may be comprised of an electroconductive material containing palladium. Palladium is a material less likely to dissolve into the solder than silver and others. For this reason, the molten residual solder becomes more likely to flow toward the first electrode layer, and the electroconductive material forming the first electrode layer can be prevented from dissolving into the solder.

In the above electronic component, the second electrode layer may be comprised of an electroconductive material containing glass frit. This enhances the stick of the second electrode layer to the first electrode layer, whereby the electroconductive material forming the first electrode layer can be prevented from dissolving into the solder.

The above electronic component may be so configured that the substrate is provided with a through hole filled with an electroconductive member, that the first electrode layer is formed in a region including an aperture of the through hole on the substrate, and that the second electrode layer is formed on the first electrode layer so as to block the aperture of the through hole. As the second electrode layer laid on the first electrode layer blocks the aperture of the through hole in this manner, the molten residual solder is prevented from flowing from the second electrode layer toward the first electrode layer into the through hole. For this reason, the electroconductive member in the through hole can be prevented from dissolving into the residual solder.

DESCRIPTION OF THE PREFERRED EMBODIMENTS

Multilayer piezoelectric devices as preferred embodiments of the electronic component according to the present invention will be described below in detail with reference to the drawings. Identical or equivalent portions will be denoted by the same reference symbols throughout the description of the drawings, without redundant description.

First Embodiment

Figure 1:
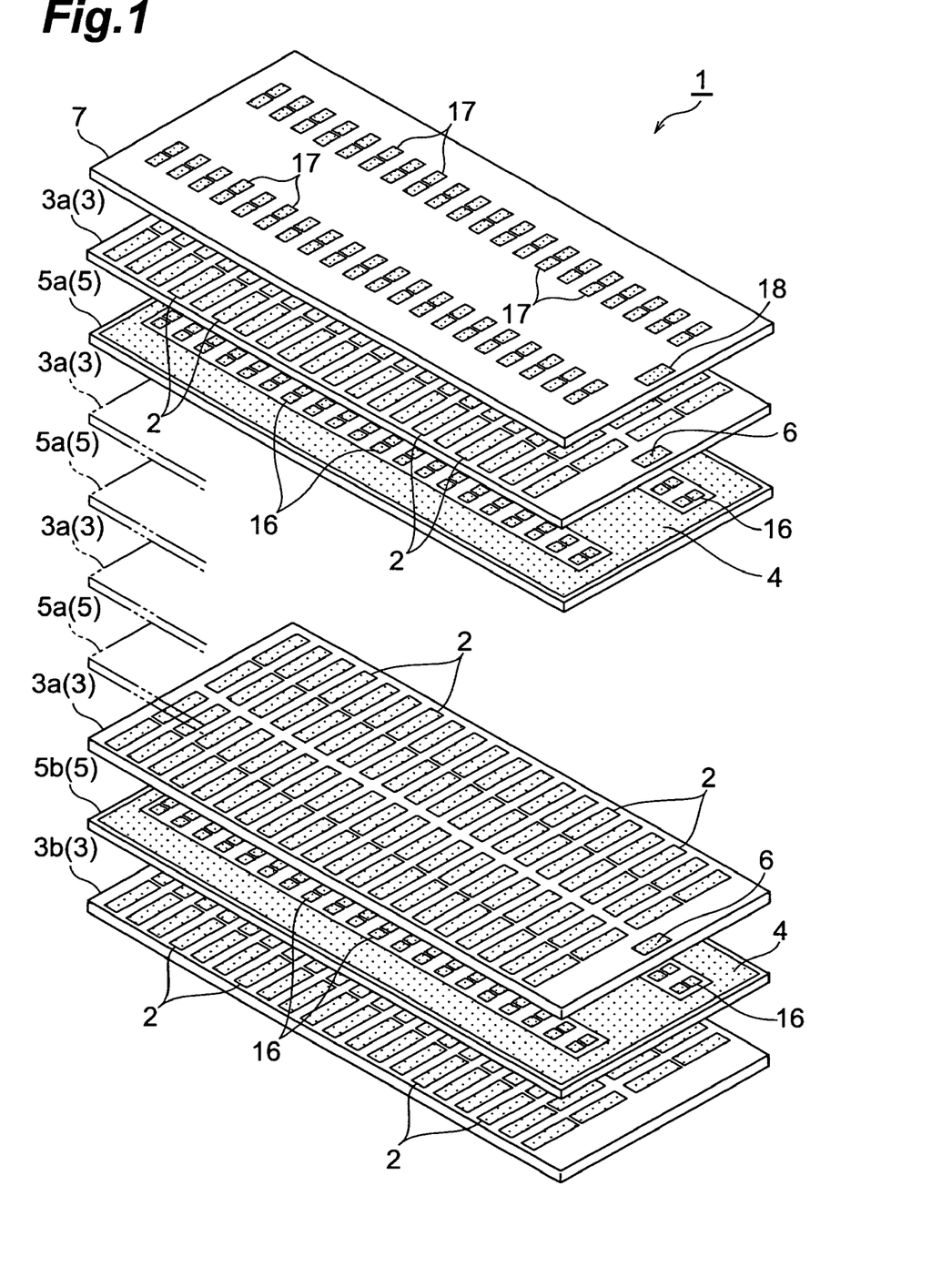
FIG. 1 is an exploded perspective view of a multilayer piezoelectric device according to the first embodiment.

As shown in FIG. 1, the multilayer piezoelectric device (electronic component) 1 consists of an alternate stack of piezoelectric layers 3 in each of which individual electrodes 2 are formed, and piezoelectric layers 5 in each of which a common electrode 4 is formed; and a piezoelectric layer 7 as the uppermost layer in which terminal electrodes 17, 18 are formed.

Each piezoelectric layer 3, 5, or 7 consists primarily of a ceramic material such as lead zirconate titanate (PZT) and is formed, for example, in a rectangular thin plate shape of "10 mm×30 mm and 30 μm thick." The individual electrodes 2 and common electrodes 4 are made of an electroconductive material consisting primarily of silver and palladium, and are formed in a pattern by screen printing. Instead of the alloy of silver and palladium, the individual electrodes 2 and common electrodes 4 may be made of an alloy of gold and palladium, an alloy of gold, palladium, and platinum, or the like, or may be made of a metal without palladium (e.g., only silver). This also applies similarly to each of electrodes described below, except for the terminal electrodes 17, 18.

Figure 2:
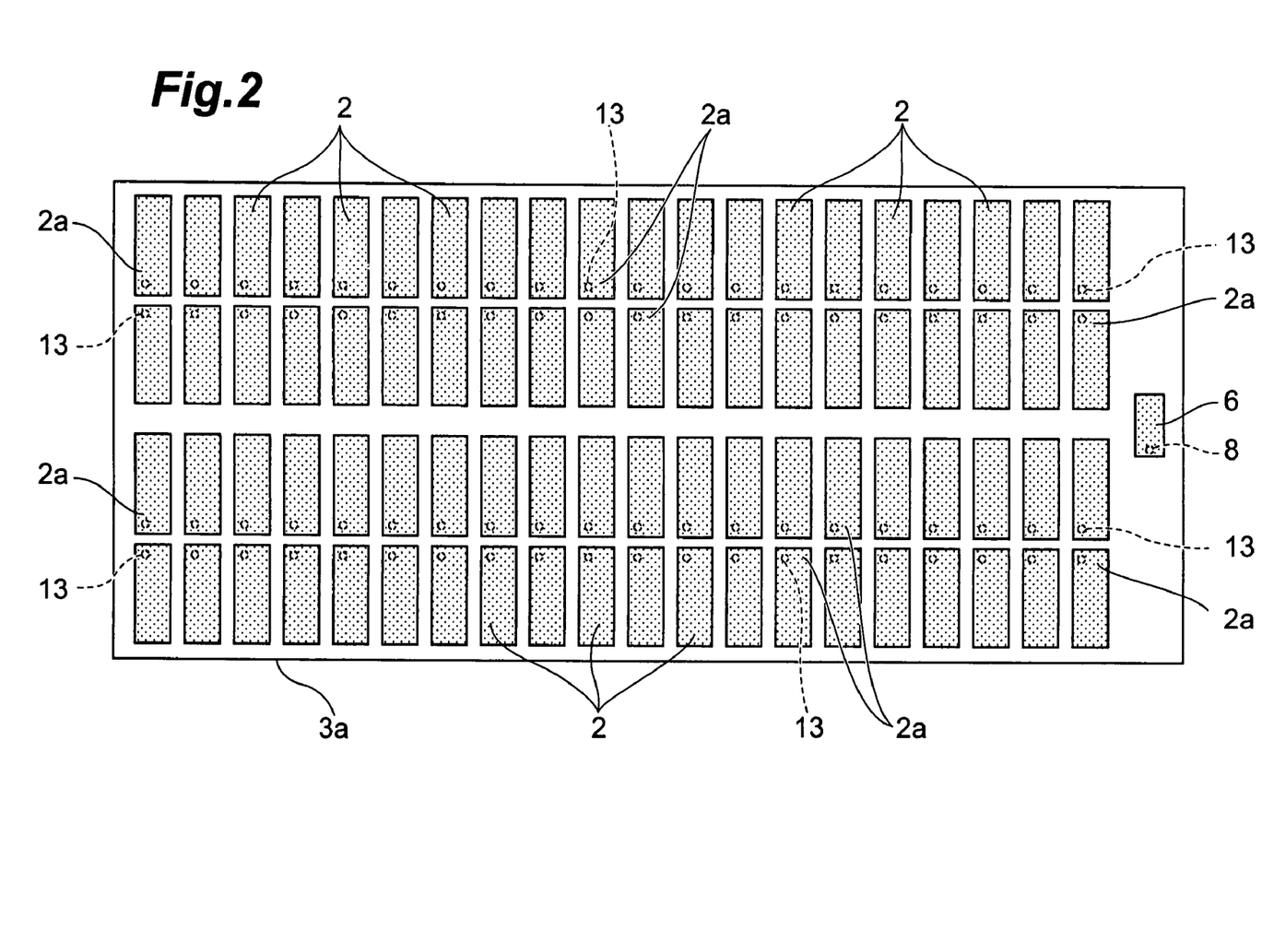
FIG. 2 is a plan view of the second, fourth, sixth, and eighth piezoelectric layers in the multilayer piezoelectric device shown in FIG. 1.

A plurality of rectangular individual electrodes 2 are arranged in a matrix, as shown in FIG. 2, on the upper surfaces of the second, fourth, sixth, and eighth piezoelectric layers 3a as counted from the uppermost piezoelectric layer 7. Each individual electrode 2 is placed so that the longitudinal direction thereof is perpendicular to the longitudinal direction of the piezoelectric layer 3a, and adjacent individual electrodes 2, 2 are placed with a predetermined space to achieve electrical independence of each other and to prevent influence of each other's vibrations.

Let the longitudinal direction of the piezoelectric layers 3a be a row direction and the direction perpendicular to the longitudinal direction be a column direction. Then the individual electrodes 2 are arranged, for example, in a matrix of four rows and seventy five columns (the drawing shows a matrix of four rows and twenty columns for clarity). This matrix arrangement of multiple individual electrodes 2 enables efficient arrangement for the piezoelectric layers 3a, and it is thus feasible to achieve miniaturization of the multilayer piezoelectric device 1 or high integration of individual electrodes 2, while maintaining the area of active parts contributing to vibration (displacement) in the piezoelectric layers 3a.

The individual electrodes 2 in the first row and in the second row have their respective ends opposed between the first row and the second row, as connection ends 2a, and are connected to electroconductive members in through holes 13 formed immediately below the connection ends 2a in the piezoelectric layer 3a. Similarly, the individual electrodes 2 in the third row and in the fourth row have their respective ends opposed between the third row and the fourth row, as connection ends 2a, and are connected to electroconductive members in through holes 13 formed immediately below the connection ends 2a in the piezoelectric layer 3a. The electroconductive members are made, for example, of the same material as the individual electrodes 2 and common electrodes 4.

Furthermore, a relay electrode 6 for electrical connection between common electrodes 4 of the piezoelectric layers 5 located up and down is formed in an edge region on the upper surface of each piezoelectric layer 3a. This relay electrode 6 is connected to an electroconductive member in a through hole 8 formed immediately below it in the piezoelectric layer 3a.

Figure 3:
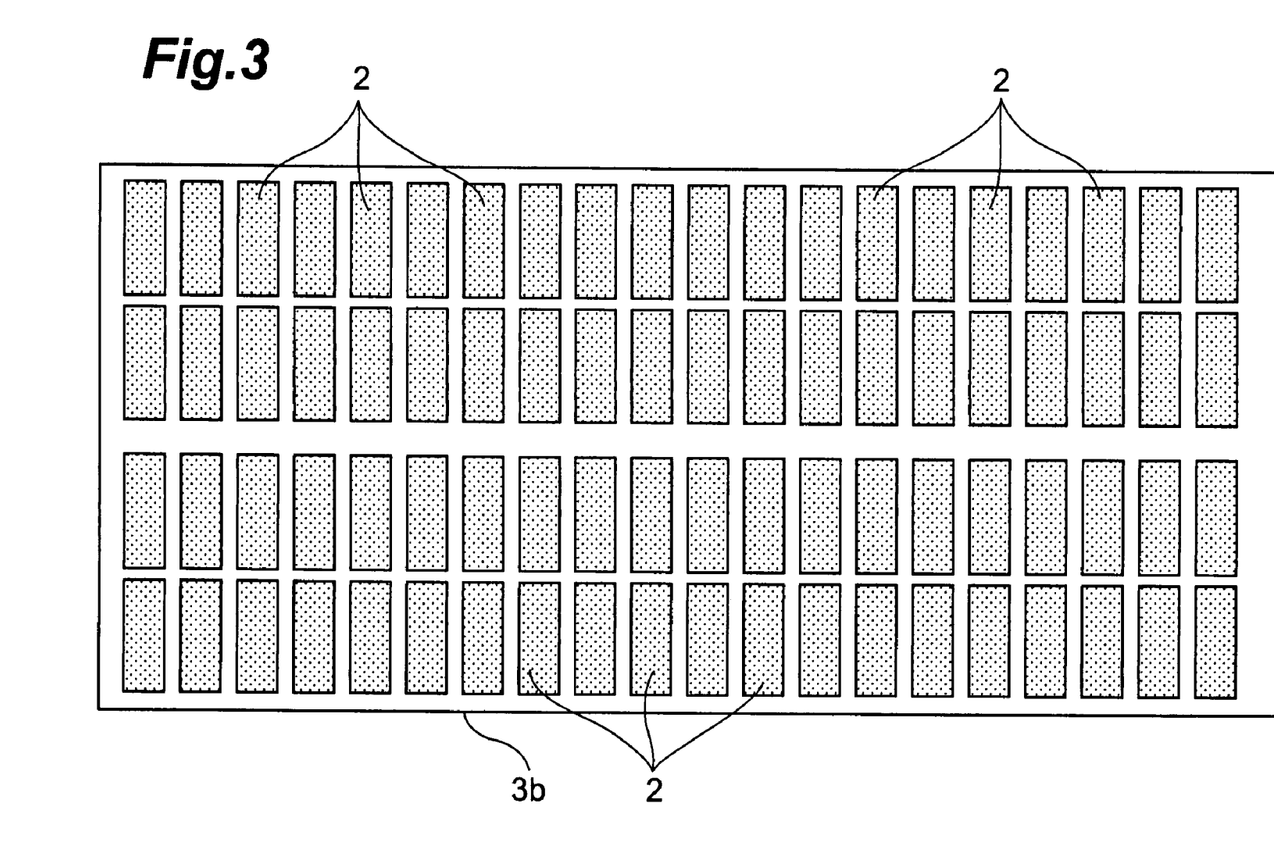
FIG. 3 is a plan view of the lowermost piezoelectric layer in the multilayer piezoelectric device shown in FIG. 1.

Individual electrodes 2 are also arranged in a matrix on the upper surface of the lowermost piezoelectric layer 3b, as in the second, fourth, sixth, eighth piezoelectric layers 3a described above. However, the lowermost piezoelectric layer 3b is different from the piezoelectric layers 3a in that the relay electrode 6 and through holes 8, 13 are not formed, as shown in FIG. 3.

Figure 4:
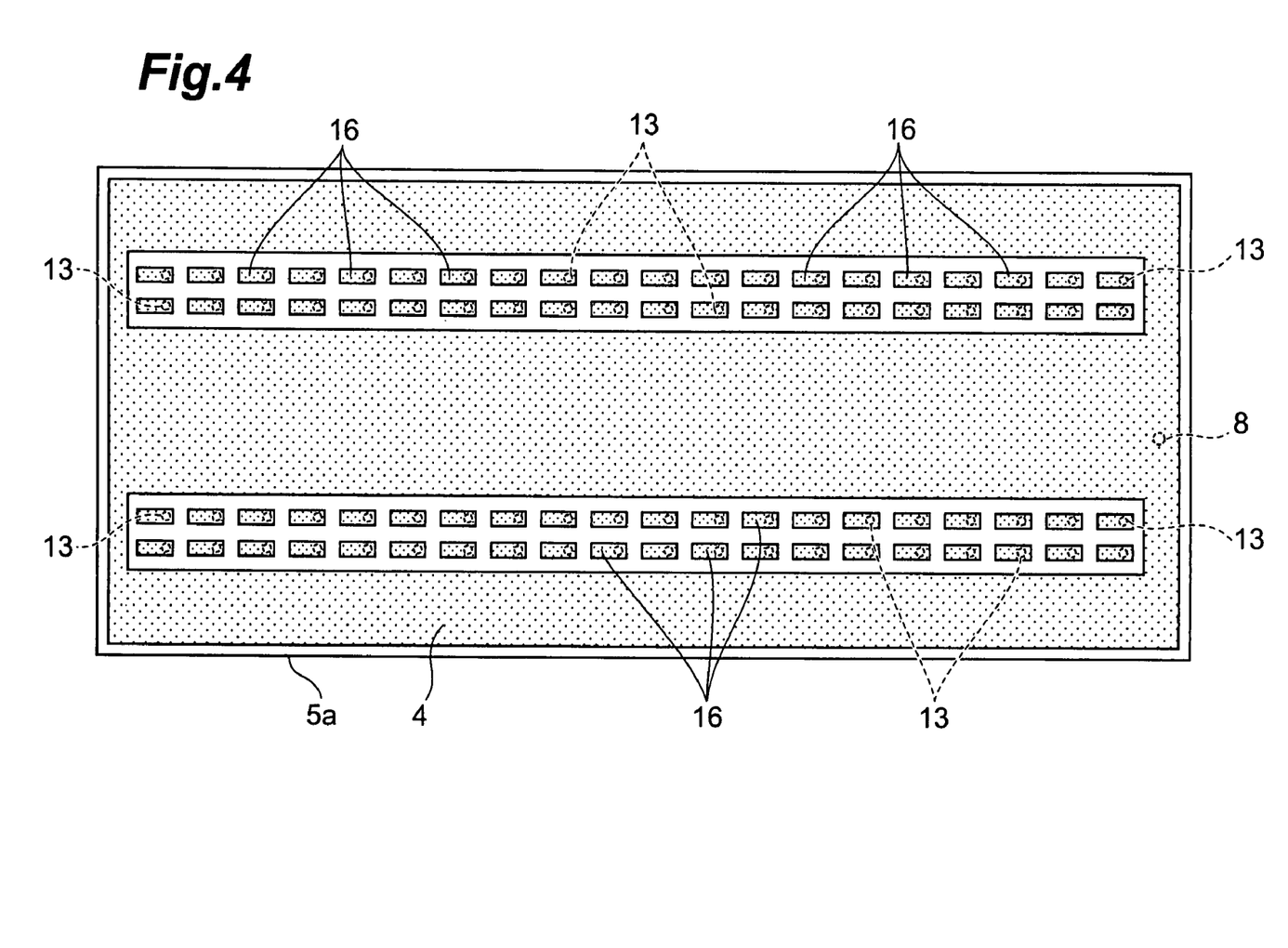
FIG. 4 is a plan view of the third, fifth, and seventh piezoelectric layers in the multilayer piezoelectric device shown in FIG. 1.

As shown in FIG. 4, relay electrodes 16 are formed so as to face the respective connection ends 2a of the piezoelectric layers 3a in the stack direction of the multilayer piezoelectric device 1 (in other words, the thickness direction of multilayer piezoelectric device 1, i.e., the thickness direction of piezoelectric layers 3, 5), on the upper surfaces of the third, fifth, and seventh piezoelectric layers 5a as counted from the uppermost piezoelectric layer 7. Each relay electrode 16 is connected to an electroconductive member in a through hole 13 formed immediately below it in the piezoelectric layer 5.

Furthermore, a common electrode 4 is formed on the upper surface of each piezoelectric layer 5a. This common electrode 4 surrounds each of a group of relay electrodes 16 in the first row and in the second row and a group of relay electrodes 16 in the third row and in the fourth row, with a predetermined space, and overlaps the portions except for the connection ends 2a of the respective individual electrodes 2, when viewed from the stack direction. This permits the whole of portions facing the portions except for the connection ends 2a of the respective individual electrodes 2 in the piezoelectric layers 3, 5 to be effectively used as active parts contributing to vibration. The common electrode 4 is formed with a predetermined space from the peripheral part of each piezoelectric layer 5a, and is connected to an electroconductive member in a through hole 8 formed in the piezoelectric layer 5 so as to face the relay electrode 6 of the piezoelectric layer 3a in the stack direction.

Figure 5:
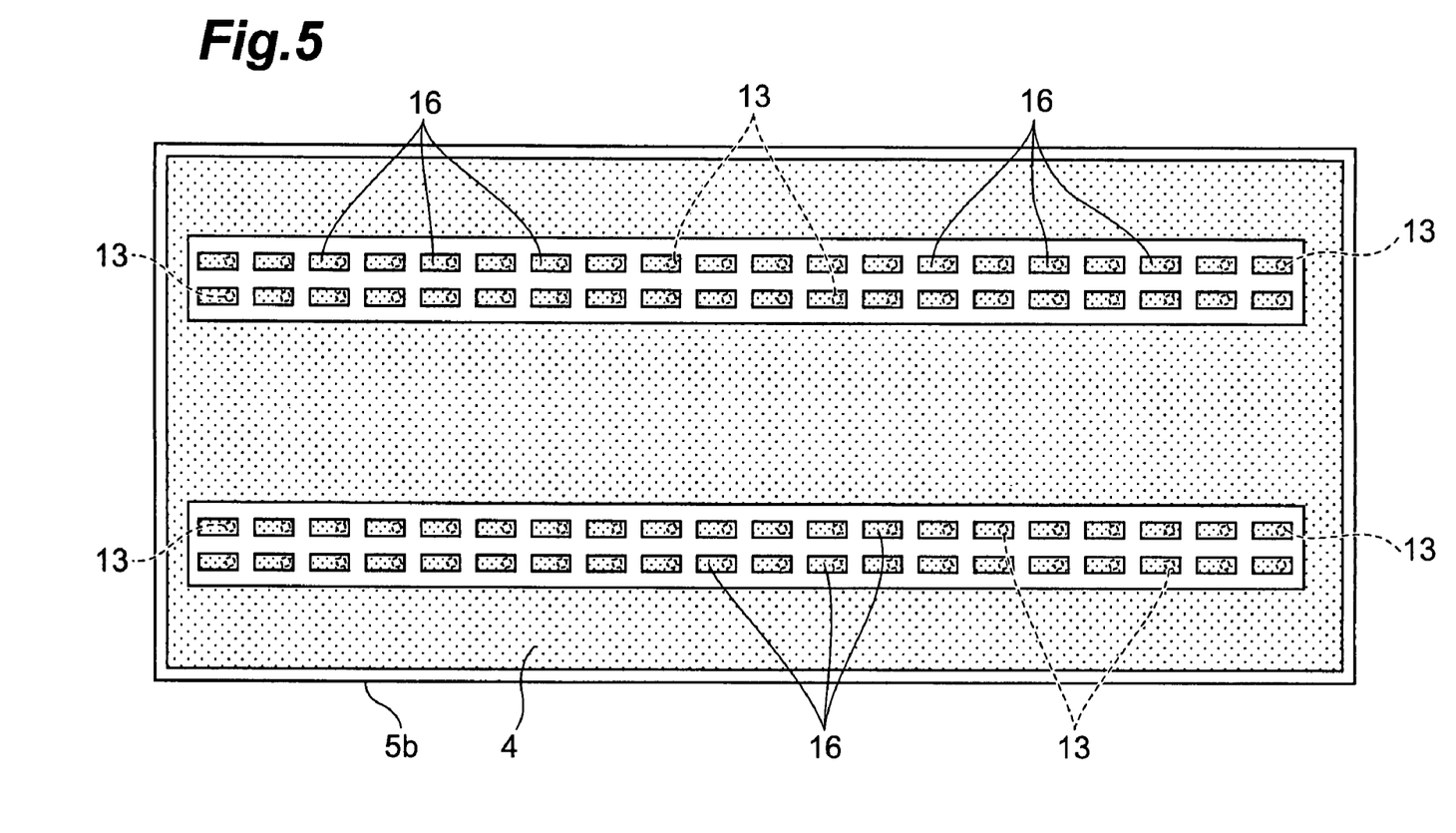
FIG. 5 is a plan view of the ninth piezoelectric layer in the multilayer piezoelectric device shown in FIG. 1.

Relay electrodes 16 and common electrode 4 are also formed on the upper surface of the ninth piezoelectric layer 5b, as in the third, fifth, and seventh piezoelectric layers 5a described above. However, the ninth piezoelectric layer 5b is different from the piezoelectric layers 5a in that the through hole 8 is not formed, as shown in FIG. 5.

Figure 6:
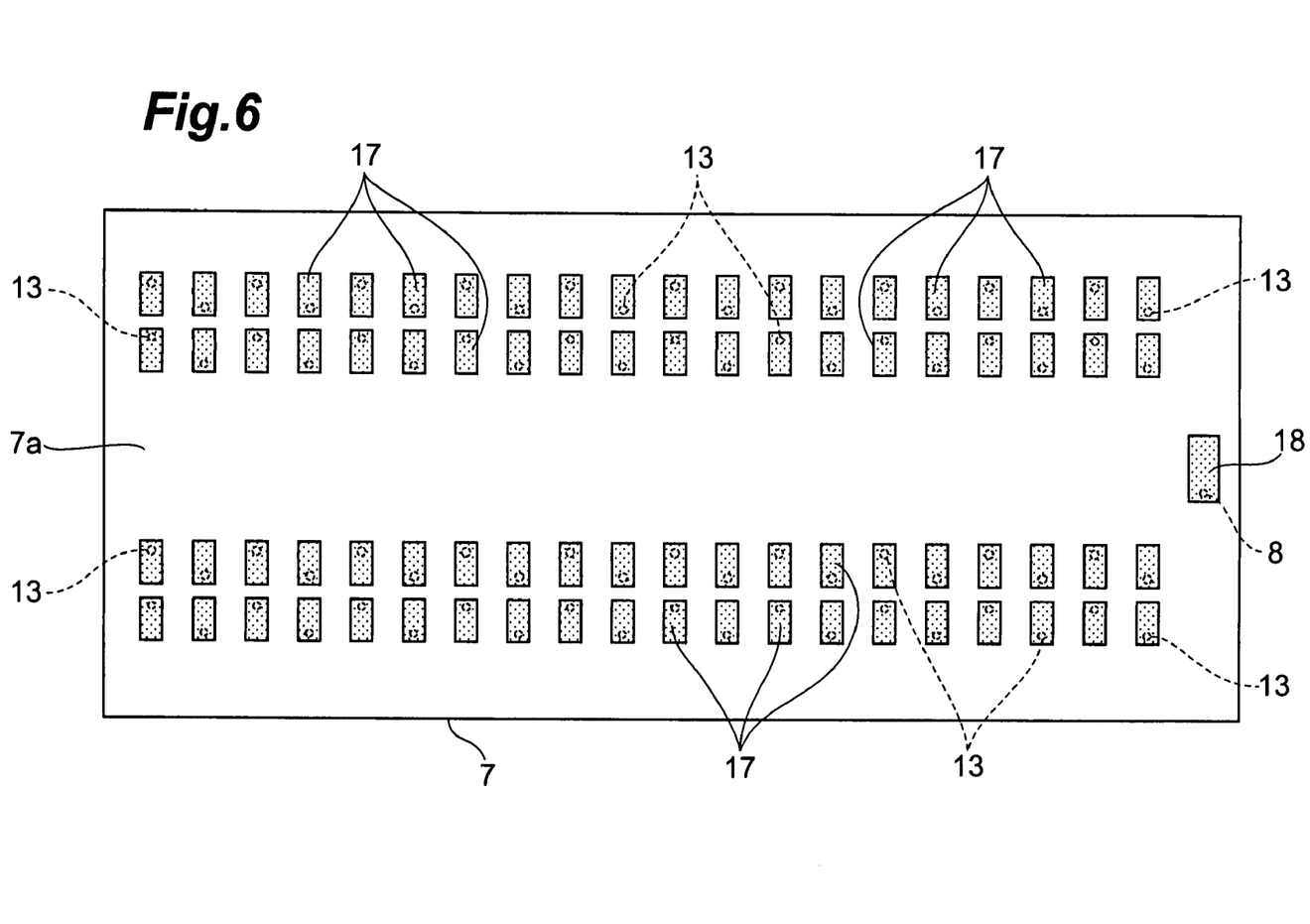
FIG. 6 is a plan view of the uppermost piezoelectric layer in the multilayer piezoelectric device shown in FIG. 1.

As shown in FIG. 6, terminal electrodes 17 are formed so as to face connection ends 2a of the respective individual electrodes 2 of the piezoelectric layer 3a in the stack direction, on the upper surface of the uppermost piezoelectric layer 7, and a terminal electrode 18 is formed so as to face the relay electrode 6 of the piezoelectric layer 3a in the stack direction. Each terminal electrode 17 is connected to an electroconductive member in a through hole 13 formed immediately below it in the piezoelectric layer 7, and the terminal electrode 18 is connected to an electroconductive member in a through hole 8 formed immediately below it in the piezoelectric layer 7. Lead wires of FPC (flexible printed circuit board) or the like are soldered to these terminal electrodes 17, 18, for connection to a drive power supply.

Figure 7:
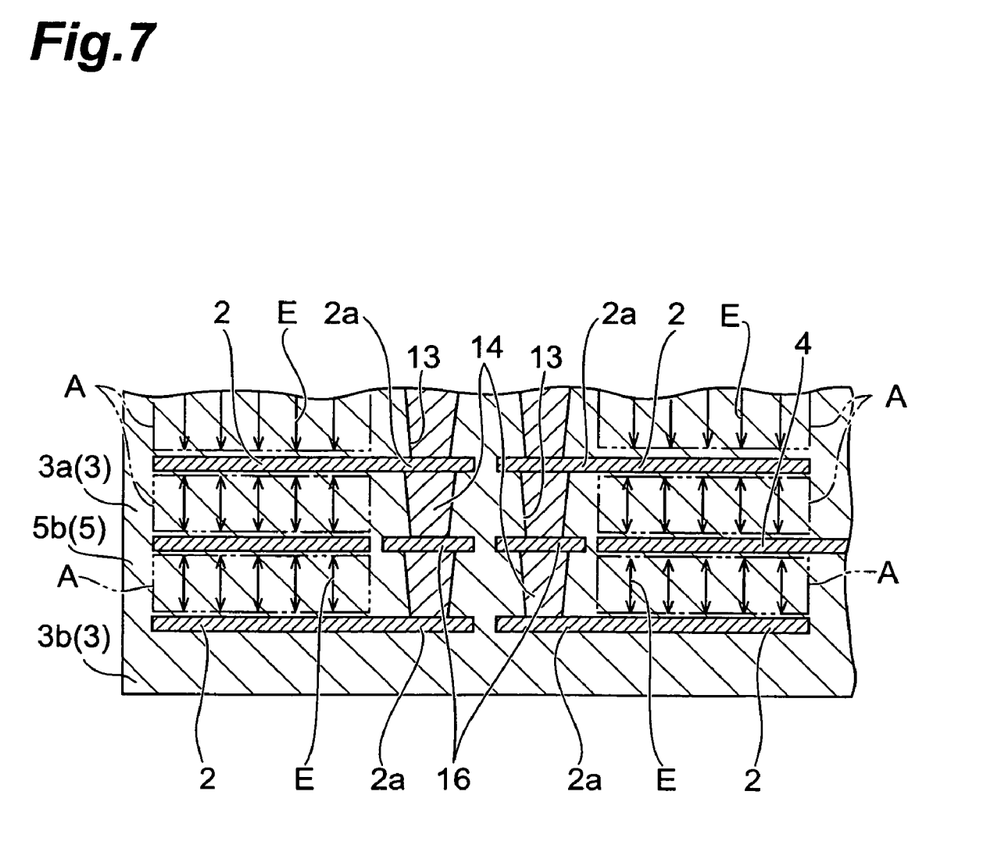
FIG. 7 is an enlarged partial sectional view along the direction normal to the longitudinal direction of the multilayer piezoelectric device shown in FIG. 1.

By the stack of the piezoelectric layers 3, 5, and 7 with the electrode patterns formed as described above, five individual electrodes 2 are aligned through the relay electrodes 16 in the stack direction, for each terminal electrode 17 of the uppermost layer, and the electrodes 2, 16, and 17 thus aligned are electrically connected by the electroconductive members 14 in the through holes 13, as shown in FIG. 7. On the other hand, for the terminal electrode 18 of the uppermost layer, four common electrodes 4 are aligned through the relay electrodes 6 in the stack direction, and the electrodes 4, 6, and 18 thus aligned are electrically connected by the electroconductive members 14 in the through holes 8.

If through holes 13, 13 adjacent in the stack direction are formed with deviation of the center axis from each other in each piezoelectric layer 3, 5, 7, electrical connection can be more securely established by the electroconductive members 14 in the through holes 13. This is also the case with the through holes 8, 8 adjacent in the stack direction.

In this electrical connection in the multilayer piezoelectric device 1, when a voltage is applied between predetermined terminal electrode 17 and terminal electrode 18, the voltage is applied between the individual electrodes 2 aligned under the predetermined terminal electrode 17, and common electrodes 4. This results in establishing electric fields E in the portions between the individual electrodes 2 and common electrodes 4, as shown in FIG. 7, in the piezoelectric layers 3, 5, whereby these portions are displaced as active parts A. By selecting a terminal electrode 17 to which the voltage is to be applied, therefore, it is feasible to displace the active parts A aligned under the selected terminal electrode 17, in the stack direction, among the active parts A corresponding to the respective individual electrodes 2 arranged in the matrix. The multilayer piezoelectric device 1 of this configuration is applied to the drive source of various devices involving small displacement, such as control of a valve of a micropump.

Figure 8:
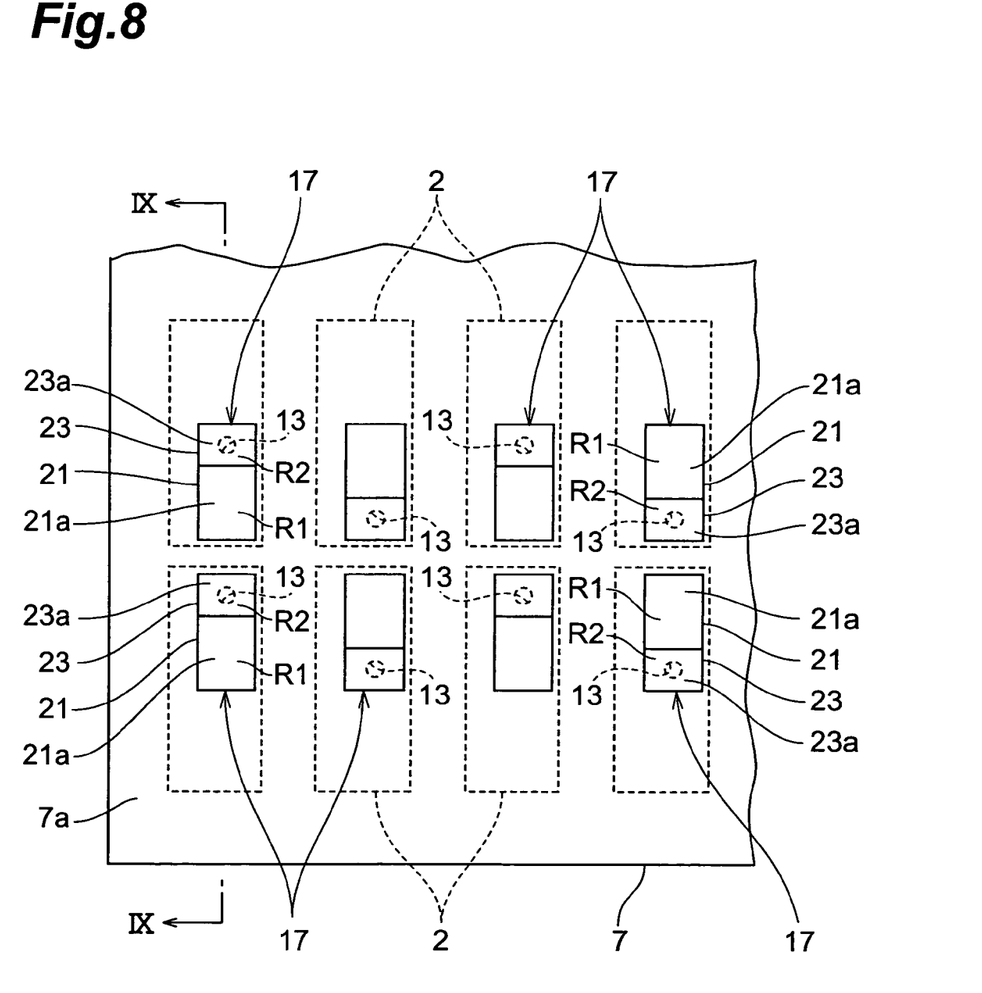
FIG. 8 is an enlarged partial plan view of the multilayer piezoelectric device shown in FIG. 1.

Next, the aforementioned terminal electrodes 17 will be described below in more detail with reference to FIGS. 8 and 9. FIG. 8 is an enlarged partial plan view of multilayer piezoelectric device 1, and FIG. 9 an enlarged partial sectional view along IX-IX line shown in FIG. 8.

Figure 9:
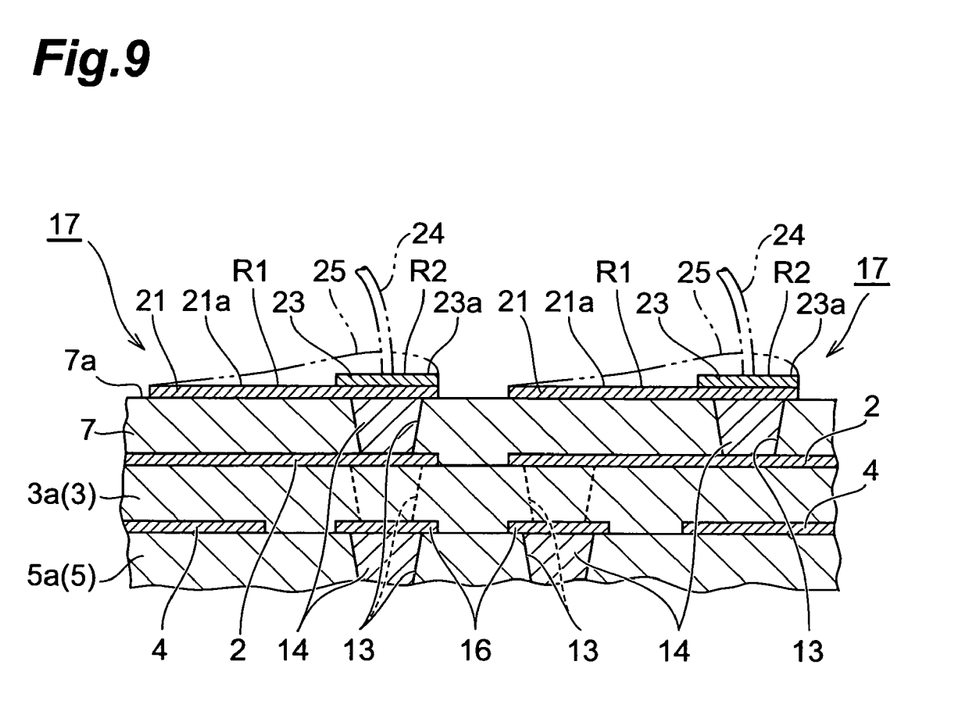
FIG. 9 is an enlarged partial sectional view along IX-IX line shown in FIG. 8.

As shown in FIGS. 8 and 9, each terminal electrode 17 has a first electrode layer 21 of rectangular shape formed on a surface 7a of the piezoelectric layer (substrate) 7, and a second electrode layer 23 of rectangular shape formed on a predetermined portion of a surface 21a of the first electrode layer 21 (a portion facing the through hole 13 in the stack direction). The first electrode layer 21 is made of an electroconductive material consisting primarily of silver and palladium, and is connected to an electroconductive member 14 in a through hole 13 formed in the piezoelectric layer 7. The second electrode layer 23 is made of an electroconductive material consisting primarily of silver, and is laid on the first electrode layer 21 so as to cover the aperture of through hole 13.

In this configuration, the terminal electrode 17 has a first region R1 located at a first height from the surface 7a of the piezoelectric layer 7, and a second region R2 located at a second height higher than the first height from the surface 7a of the piezoelectric layer 7. Namely, an exposed portion of the surface 21a of the first electrode layer 21 (a portion except for the predetermined portion where the second electrode layer 23 is formed, in the surface 21a) is the first region R1, and a surface 23a of the second electrode layer 23 is the second region R2.

In the multilayer piezoelectric device 1, as described above, when a lead wire (external terminal) 24 is soldered to a terminal electrode 17, as shown in FIG. 9, the lead wire 24 can be placed on the second region R2 higher in height than the first region R1 from the surface 7a of the piezoelectric layer 7. This facilitates the flow of molten solder 25 from the second region R2 toward the first region R1 during soldering. For this reason, the solder 25 is prevented from overflowing from the area on the terminal electrode 17 even if the amount of the solder for soldering the lead wire 24 to the terminal electrode 17 is increased in order to enhance the certainty of connection between the terminal electrode 17 and the lead wire 24. Therefore, it is feasible to securely solder the lead wire 24 to the terminal electrode 17, while preventing the solder 25 from overflowing from the area on the terminal electrode 17.

The first electrode layer 21 was made of the electroconductive material consisting primarily of silver and palladium, but the first electrode layer 21 may also be made of another electroconductive material if it contains palladium. The reason is that the first electrode layer 21, if containing palladium, makes the so-called solder leaching unlikely to occur even if the first electrode layer 21 is a thin film. Specifically, the first electrode layer 21 preferably contains 3 or more % by weight of palladium and more preferably contains 5 or more % by weight of palladium, based on the total weight of metal elements. Unless the first electrode layer 21 contains 3 or more % by weight of palladium, the so-called solder leaching will become easier to occur, and the molten solder 25 can fail to appropriately flow over the entire first region R1. Where the second electrode layer 23 is made of the electroconductive material consisting primarily of silver as described above, the first electrode layer 21 is preferably made of the electroconductive material consisting primarily of silver and palladium; however, the first electrode layer 21 may also be made of an electroconductive material consisting primarily of gold and palladium, an electroconductive material consisting primarily of gold, platinum, and palladium, or the like.

The first height of the first region R1 is preferably not more than 3 μm and more preferably not more than 2 μm. If the first height exceeds 3 μm, the molten solder 25 will become easier to flow in an unwanted direction. Furthermore, the difference between the first height of the first region R1 and the second height of the second region R2 is preferably in the range of 5 μm to 20 μm and more preferably in the range of 7 μm to 15 μm. If the difference between the first height and the second height is less than 5 μm, the molten solder 25 will become hard to flow from the second region R2 toward the first region R1; if the difference between the first height and the second height exceeds 20 μm, it will be difficult to control the direction of the flow of the molten solder 25. Here the first height and second height are those on the basis of the highest point (in consideration of surface roughness as well) in the first region R1 and in the second region R2.

In the multilayer piezoelectric device 1, since the terminal electrode 17 is comprised of the stack of the first electrode layer 21 and the second electrode layer 23, the terminal electrode 17 can be readily provided with the first region R1 located at the first height from the surface 7a of the piezoelectric layer 7 and the second region R2 located at the second height higher than the first height from the surface 7a of the piezoelectric layer 7.

Furthermore, in the multilayer piezoelectric device 1, since on the first electrode layer 21 the second electrode layer 23 covers the aperture of the through hole 13, the electroconductive member 14 in the through hole 13 can be prevented from dissolving into the molten solder to break the electrical connection in the through hole 13 on the occasion of soldering the lead wire 24 to the surface 23a of the second electrode layer 23 being the second region R2.

The electroconductive material forming the second electrode layer 23 preferably contains glass frit. The reason is that it can improve the stick of the second electrode layer 23 to the first electrode layer 21 and it can more securely prevent the electroconductive member 14 in the through hole 13 from dissolving into the molten solder on the occasion of soldering the lead wire 24 to the surface 23a of the second electrode layer 23.

The width of the second region R2 is preferably approximately equal to the width of the first region R1, but may be about a quarter or more of the width of the first region R1. Furthermore, the area of the second region R2 is preferably 15% to 60% of the area of the first region R1 and more preferably 20% to 50% thereof.

Incidentally, a configuration similar to the aforementioned terminal electrode 17 is also adopted for the terminal electrode 18, and thus the same effect as by the terminal electrode 17 is achieved by the terminal electrode 18.

Supposing the longitudinal direction of the piezoelectric layer 7 is the row direction and the direction perpendicular to the longitudinal direction is the column direction, as shown in FIG. 6, each terminal electrode 17 faces the connection ends 2a of the respective individual electrodes 2 of the piezoelectric layers 3a in the stack direction, and thus the terminal electrodes 17 are arranged, for example, in a matrix of four rows and seventy five columns on the surface 7a of the piezoelectric layer 7 (the drawing shows a matrix of four rows and twenty columns for clarity). Each terminal electrode 17 formed in the rectangular shape is placed so that the longitudinal direction thereof agrees with the column direction.

The through holes 13 formed immediately below the respective terminal electrodes 17 arrayed along the row direction on the surface 7a of the piezoelectric layer 7 are staggered in the row direction. The second electrode layer 23 is laid on the first electrode layer 21 so as to cover the aperture of through hole 13. By these configurations, as shown in FIG. 8, in each of the first row to the fourth row, one terminal electrode 17 among two terminal electrodes 17, 17 adjacent in the row direction has the second region R2 on one end side in the longitudinal direction thereof, and the other terminal electrode 17 has the second region R2 on the other end side in the longitudinal direction thereof.

Therefore, it enables the following soldering: the lead wire 24 is soldered to the one end side in the longitudinal direction, for one terminal electrode 17 out of adjacent terminal electrodes 17, 17, while the lead wire 24 is soldered to the other end side in the longitudinal direction, for the other terminal electrode 17. This prevents the lead wires 24 to be connected to the respective terminal electrodes 17, from adjoining in the row direction. Therefore, it can facilitate the connection of lead wires 24 to the respective terminal electrodes 17 and securely prevent a short circuit due to the solder joining adjacent terminal electrodes 17.

Since each terminal electrode 17 is formed in the rectangular shape whose longitudinal direction is the direction (column direction) perpendicular to the array direction of terminal electrodes 17 (i.e., the row direction), the length of the first region R1 in the column direction can be made not less than the length of the second region R2 in the column direction. This permits a wide area to be secured for the region on which the molten solder 25 flows during soldering (i.e., the first region R1), and it can more securely prevent the solder 25 from overflowing from the area on the terminal electrode 17. Furthermore, since the distance is kept long enough between the second regions R2, R2 to which the lead wires 24 are soldered in the respective terminal electrodes 17, 17 adjacent to each other, even if the spacing between the adjacent terminal electrodes 17, 17 is made narrower, the solder 25 can be more securely prevented from joining the adjacent terminal electrodes 17, 17.

Next, a production procedure of the multilayer piezoelectric device 1 will be described. First, a substrate paste is prepared by mixing an organic binder, an organic solvent, etc. into a piezoelectric ceramic material consisting primarily of lead zirconate titanate or the like, and green sheets for the respective piezoelectric layers 3, 5, 7 are formed using the substrate paste. An electroconductive paste is also prepared by mixing an organic binder, an organic solvent, etc. into a metal material consisting of silver and palladium in a predetermined proportion.

Subsequently, laser light is applied to predetermined positions on the green sheets for the respective piezoelectric layers 3, 5, 7 to form the through holes 8, 13. Then filling screen print with the electroconductive paste is carried out into the through holes 8, 13 to form the electroconductive members 14. Thereafter, screen print with the electroconductive paste is carried out on the green sheets for the respective piezoelectric layers 3, 5 to form the electrodes 2, 4, 6, 16. Screen print with the electroconductive paste is also carried out on the green sheet for the uppermost piezoelectric layer 7 to form the first electrode layers 21 as ground electrodes.

Subsequently, the green sheets with the electrode patterns thereon are stacked in the aforementioned order and pressed in the stack direction to fabricate a green laminate. This green laminate is degreased and baked, and thereafter, baked electrodes of an electroconductive material containing silver and glass frit are placed on the sintered sheet for the piezoelectric layer 7 to form the second electrode layers 23. Thereafter, a polarization process is carried out to complete the multilayer piezoelectric device 1.

The reason why the electroconductive material containing silver is used as the material of the second electrode layers 23 is that it becomes easier to place the solder 25 thereon on the occasion of soldering the lead wires 24 thereto. Gold, copper, or the like may also be used as the material of the second electrode layers 23. Furthermore, the second electrode layers 23 may also be formed by another method such as sputtering, electroless plating, or the like.

Second Embodiment

The multilayer piezoelectric device 1 according to the second embodiment is different in the configuration of terminal electrodes 17, 18 from the multilayer piezoelectric device 1 of the first embodiment described above. The multilayer piezoelectric device 1 of the second embodiment will be described below with focus on the configuration of terminal electrodes 17, 18.

Figure 10:
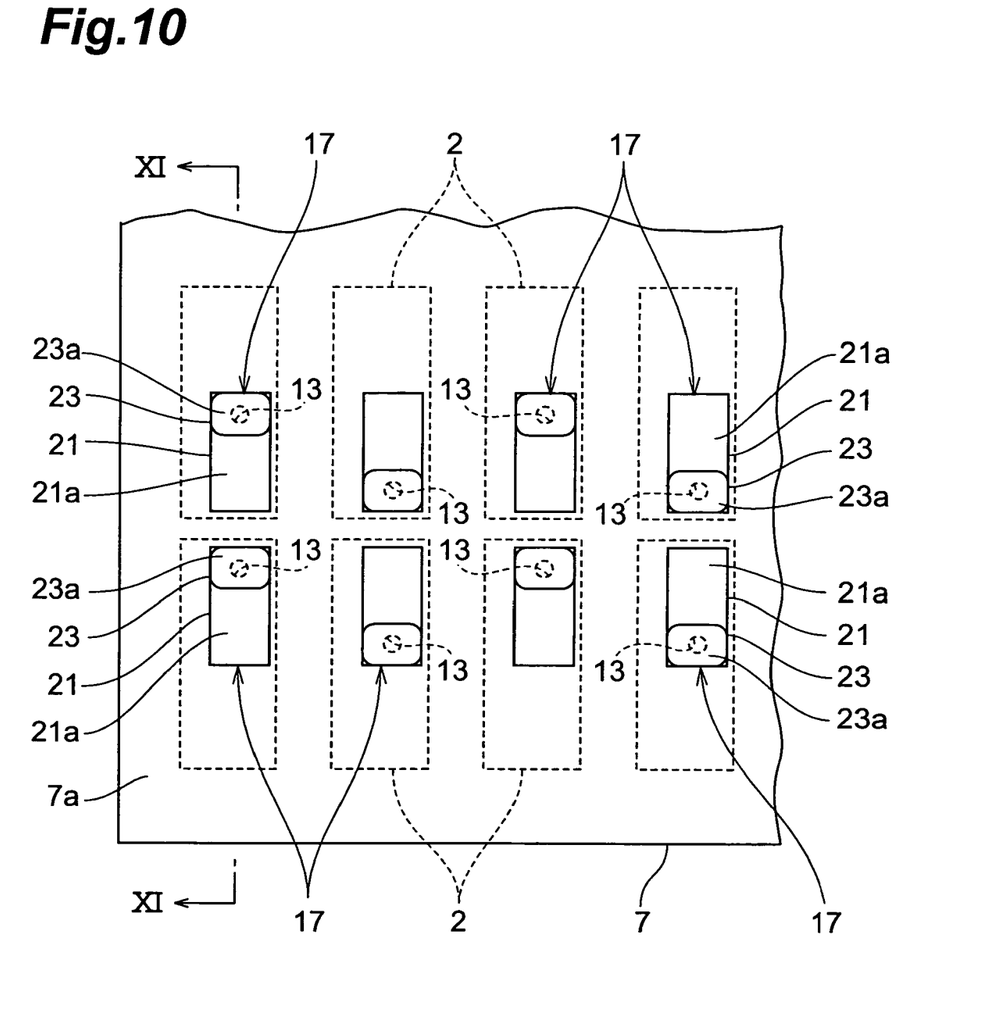
FIG. 10 is an enlarged partial plan view of a multilayer piezoelectric device according to the second embodiment.

The terminal electrode 17 will be described in more detail with reference to FIGS. 10 and 11. FIG. 10 is an enlarged partial plan view of multilayer piezoelectric device 1, and FIG. 11 an enlarged partial sectional view along XI-XI line shown in FIG. 10.

Figure 11:
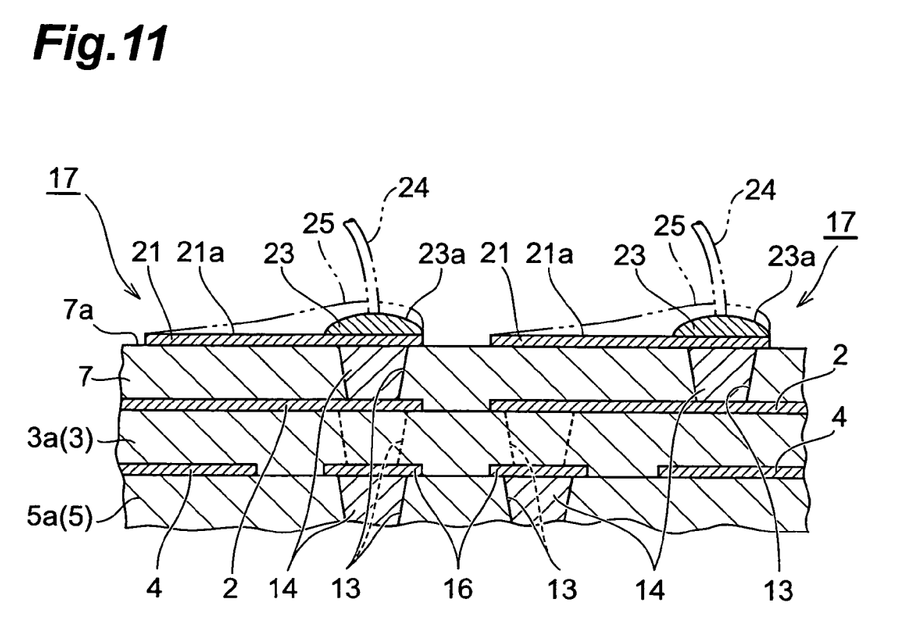
FIG. 11 is an enlarged partial sectional view along XI-XI line shown in FIG. 10.

As shown in FIGS. 10 and 11, each terminal electrode 17 has a first electrode layer 21 of rectangular shape formed on the surface 7a of the piezoelectric layer (substrate) 7, and a second electrode layer 23 formed in a convex shape on the surface 21a of the first electrode layer 21 so as to cover a part of this first electrode layer 21. The second electrode layer 23 has a domed shape. Namely, the surface 23a of the second electrode layer 23 has a curved shape. Since the second electrode layer 23 is laid on the first electrode layer 21, the height of the top of the second electrode layer 23 is higher than the surface 21a of the first electrode layer 21 with respect to the surface 7a of the piezoelectric layer 7.

The first electrode layer 21 is formed in a region including the aperture of through hole 13 of taper shape formed in the piezoelectric layer 7, and is electrically connected to the electroconductive member 14 in through hole 13. The second electrode layer 23 is formed on the first electrode layer 21 so as to block the aperture of the through hole 13.

Since the second electrode layer 23 laid on the first electrode layer 21 is formed in the domed shape as described above, point contact is achieved between the external terminal and the second electrode layer 23 on the occasion of soldering the external terminal of lead wire 24 to the second electrode layer 23 of the terminal electrode 17 in order to establish electrical connection between the terminal electrode 17 and the lead wire 24. This results in concentrating heat on the top of the second electrode layer 23 to facilitate melting of the solder, whereby the lead wire 24 can be securely soldered to the terminal electrode 17.

On this occasion, the molten residual (remaining) solder 25 smoothly flows across the surface 23a of curved shape of the second electrode layer 23 toward the first electrode layer 21. At this time, in order to keep the flow of solder 25 good, the difference between the height of the surface 21a of the first electrode layer 21 and the height of the top of the second electrode layer 23 is preferably not less than 5 μm. This can prevent the solder 25 from overflowing from the area on the terminal electrode 17 even if the amount of the solder is increased in order to achieve securer connection between the terminal electrode 17 and the external terminal. In order to make the solder 25 unlikely to flow off the area on the terminal electrode 17, the thickness of the first electrode layer 21 is preferably not more than 2 μm. This can prevent the so-called solder bridge in which adjacent terminal electrodes 17 are bridged by the solder, in the case where a plurality of terminal electrodes 17 are arranged in high density.

Since the second electrode layer 23 laid on the first electrode layer 21 is arranged to block the aperture of the through hole 13, the solder 25 flowing from the second electrode layer 23 toward the first electrode layer 21 is prevented from flowing into the through hole 13. For this reason, the electroconductive member 14 in the through hole 13 is prevented from dissolving into the solder 25. This can prevent breakage of the electrical connection in the through hole 13.

The electroconductive material forming the first electrode layer 21 is preferably metal (silver or the like) containing palladium, for example. The content of palladium is preferably not less than 3% and more preferably not less than 5%, based on the total amount of metal components. Palladium is a material that is less stickable to the solder than silver. For this reason, the molten solder 25 becomes easier to flow toward the first electrode layer 21 than, for example, in a case where the first electrode layer 21 is made of only silver. Since it prevents occurrence of solder leaching that the electroconductive material forming the first electrode layer 21 dissolves into the solder 25, it is feasible to prevent occurrence of detachment of the lead wire 24.

The electroconductive material forming the second electrode layer 23 is preferably metal (silver or the like) containing glass frit. If the material of the second electrode layer 23 contains silver, it becomes easier to place the solder 25 thereon during soldering of the lead wire 24. The material of the second electrode layer 23 may be gold or copper or the like, or an alloy of these, instead of silver. When these materials contain glass frit, it improves the stick of the second electrode layer 23 to the first electrode layer 21. For this reason, the solder leaching of the electroconductive material forming the first electrode layer 21 can be more securely prevented on the occasion of soldering the lead wire 24 to the surface 23a of the second electrode layer 23.

Incidentally, the configuration similar to the aforementioned terminal electrode 17 is also adopted for the terminal electrode 18, and thus the terminal electrode 18 also provides the effect similar to that of the terminal electrode 17.

As shown in FIG. 10, the through holes 13 arrayed immediately below the respective terminal electrodes 17 in the piezoelectric layer 7 are staggered in the row direction. As described above, the second electrode layer 23 is laid on the first electrode layer 21 so as to block the aperture of the through hole 13. For this reason, in each of the first to fourth rows, one terminal electrode 17 out of terminal electrodes 17, 17 adjacent in the row direction has the second electrode layer 23 on one end side in the longitudinal direction thereof, and the other terminal electrode 17 has the second electrode layer 23 on the other end side in the longitudinal direction thereof. Namely, the second electrode layers 23 are arrayed in a staggered pattern in the row direction.

Therefore, the lead wire 24 is soldered to the one end side in the longitudinal direction, for one terminal electrode 17 out of adjacent terminal electrodes 17, 17, while the lead wire 24 is soldered to the other end side in the longitudinal direction, for the other terminal electrode 17. This prevents the lead wires 24 to be connected to the respective terminal electrodes 17, from adjoining in the row direction. This facilitates the connection of the lead wires 24 to the respective terminal electrodes 17 and securely prevents the solder bridge between adjacent terminal electrodes 17.

In the terminal electrode 17, the length of the first electrode layer 21 in the column direction is preferably not less than the length of the second electrode layer 23 in the same direction. This secures a wide region for the molten solder 25 to flow on the first electrode layer 21 during soldering, whereby the solder 25 is more securely prevented from overflowing from the area on the terminal electrode 17.

The present invention is by no means intended to be limited to the first and second embodiments described above.

For example, the terminal electrode 17 was comprised of the stack of the first electrode layer 21 and the second electrode layer 23 in the first embodiment, but the terminal electrode 17 may be comprised of a single electrode layer if it has the first region R1 located at the first height from the surface 7a of the piezoelectric layer 7, and the second region R2 located at the second height higher than the first height from the surface 7a of the piezoelectric layer 7. In this case, the terminal electrode 17 is also preferably made of the electroconductive material containing palladium, in terms of suppression of the so-called solder leaching.

In the first embodiment the second electrode layer 23 was laid on the first electrode layer 21 so as to cover the aperture of the through hole 13 in order to prevent the so-called solder leaching, but the second electrode layer 23 does not always have to cover the aperture of the through hole 13 on the first electrode layer 21, in order to securely solder the lead wire 24 to the terminal electrode 17, while preventing the solder 25 from overflowing from the area on the terminal electrode 17.

In the first embodiment the piezoelectric layer 7 was provided as the uppermost layer in order to form the terminal electrodes 17 thereon and protect the internal electrodes such as the individual electrodes 2, but, if there is no problem in terms of the space and function in forming the terminal electrodes 17, the terminal electrodes 17 having the first region R1 and the second region R2 may be formed on the piezoelectric layer 3 with the internal electrodes such as the individual electrodes 2 thereon, without provision of the piezoelectric layer 7 as the uppermost layer.

In the second embodiment the first electrode layer 21 and the second electrode layer 23 were made of the different electroconductive materials, but they may also be made of an identical electroconductive material.

In the second embodiment the terminal electrodes 17 were provided on the layer different from those for the individual electrodes 2 forming the active parts, but the present invention can also be applied to the multilayer piezoelectric devices in which the terminal electrodes are provided on the same layer as the individual electrodes forming the active parts are.

Furthermore, the present invention is also applicable to a variety of electronic components comprising a substrate, and terminal electrodes formed on a surface of the substrate, without having to be limited to the multilayer piezoelectric devices 1.

The present invention enables an external terminal such as a lead wire to be securely soldered to a terminal electrode, while preventing the solder from overflowing from the area on the terminal electrode.

What is claimed is:

1. An electronic component comprising a substrate, and a terminal electrode provided on a surface of the substrate,
    wherein the terminal electrode has a first region located at a first height from the surface of the substrate, and a second region located at a second height higher than the first height from the surface of the substrate, and
    wherein the first height of the first region is not more than 3 μm, and a difference between the first height of the first region and the second height of the second region is in a range of 5 μm to 20 μm.

2. The electronic component according to claim 1, wherein the terminal electrode has a first electrode layer formed on the surface of the substrate, and a second electrode layer formed on a predetermined portion of a surface of the first electrode layer, and
    wherein an exposed portion of the surface of the first electrode layer is said first region, and a surface of the second electrode layer is said second region.

3. The electronic component according to claim 2, wherein the first electrode layer is connected to an electroconductive member in a through hole formed in the substrate, and
    wherein the second electrode layer is laid on the first electrode layer so as to cover an aperture of the through hole.

4. The electronic component according to claim 2, wherein the second electrode layer is comprised of an electroconductive material containing glass frit.

5. The electronic component according to claim 1, wherein a plurality of said terminal electrodes are arrayed along a predetermined direction on the surface of the substrate, and
    wherein one terminal electrode out of two adjacent terminal electrodes has the second region on one end side in a direction perpendicular to the predetermined direction, and the other terminal electrode has the second region on the other end side in the direction perpendicular to the predetermined direction.

6. The electronic component according to claim 1, wherein an external terminal is connected to the terminal electrode by a solder.

7. An electronic component comprising a substrate, and a terminal electrode provided on a surface of the substrate,
wherein the terminal electrode has a first electrode layer formed on the substrate, and a second electrode layer formed in a convex shape on the first electrode layer so as to cover a part of the first electrode layer,
wherein a surface of the second electrode layer has a curved shape, and
wherein the first height of the first region is not more than 3 µm, and a difference between the first height of the first region and the second height of the second region is in a range of 5 µm to 20 µm.

8. The electronic component according to claim 7, wherein the first electrode layer is comprised of an electroconductive material containing palladium.

9. The electronic component according to claim 7, wherein the second electrode layer is comprised of an electroconductive material containing glass frit.

10. The electronic component according to claim 7, wherein the substrate is provided with a through hole filled with an electroconductive member,
wherein the first electrode layer is formed in a region including an aperture of the through hole on the substrate, and
wherein the second electrode layer is formed on the first electrode layer so as to block the aperture of the through hole.

* * * * *